(12) United States Patent
Arai

(10) Patent No.: US 11,538,736 B2
(45) Date of Patent: *Dec. 27, 2022

(54) COOLING APPARATUS, SEMICONDUCTOR MODULE, AND VEHICLE

(71) Applicant: FUJI ELECTRIC CO., LTD., Kanagawa (JP)

(72) Inventor: Nobuhide Arai, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/317,776

(22) Filed: May 11, 2021

(65) Prior Publication Data

US 2021/0265239 A1 Aug. 26, 2021

Related U.S. Application Data

(63) Continuation of application No. 16/281,059, filed on Feb. 20, 2019, now Pat. No. 11,018,076.

(30) Foreign Application Priority Data

Apr. 2, 2018 (JP) .............................. JP2018-070713

(51) Int. Cl.
*H01L 23/473* (2006.01)
*H01L 25/065* (2006.01)
(Continued)

(52) U.S. Cl.
CPC ...... *H01L 23/473* (2013.01); *H01L 23/49575* (2013.01); *H01L 23/49861* (2013.01);
(Continued)

(58) Field of Classification Search
CPC .................................................... H01L 23/473
See application file for complete search history.

(56) References Cited

U.S. PATENT DOCUMENTS 10,014,236 B2    7/2018  Adachi
11,018,076 B2 *  5/2021  Arai ................... H05K 7/20854
(Continued)

FOREIGN PATENT DOCUMENTS

JP    2001516973 A    10/2001
JP    2004006811 A    1/2004
(Continued)

OTHER PUBLICATIONS

Office Action issued for counterpart Japanese Application No. 2018-070713, issued by the Japan Patent Office dated Feb. 1, 2022 (drafted on Jan. 28, 2022).
(Continued)

*Primary Examiner* — Xiaoming Liu

(57) ABSTRACT

A semiconductor module including a cooling apparatus and a semiconductor device mounted on the cooling apparatus is provided. The cooling apparatus includes a cooling fin arranged below the semiconductor device, a main-body portion flow channel through which a coolant flows in a predetermined direction to cool the cooling fin, a first coolant flow channel that is connected to one side of the main-body portion flow channel and has a first inclined portion upwardly inclined toward the main-body portion flow channel, and a conveying channel that, when seen from above, lets the coolant into the first coolant flow channel from a direction perpendicular to the predetermined direction or lets the coolant out of the first coolant flow channel in the direction perpendicular to the predetermined direction.

23 Claims, 12 Drawing Sheets

(51) Int. Cl.
*H01L 23/495* (2006.01)
*H01L 23/498* (2006.01)
*H05K 7/20* (2006.01)
*H02M 7/00* (2006.01)
*H02M 7/5387* (2007.01)
*H02P 27/06* (2006.01)

(52) U.S. Cl.
CPC ........ *H01L 25/0655* (2013.01); *H02M 7/003* (2013.01); *H02M 7/5387* (2013.01); *H05K 7/209* (2013.01); *H05K 7/20854* (2013.01); *H05K 7/20872* (2013.01); *H05K 7/20927* (2013.01); *H02P 27/06* (2013.01)

(56) References Cited

U.S. PATENT DOCUMENTS

| | | | |
|---|---|---|---|
| 2002/0043716 A1 | 4/2002 | Miller | |
| 2007/0084585 A1 | 4/2007 | Takagi | |
| 2007/0240867 A1* | 10/2007 | Amano | H01L 23/473 165/168 |
| 2008/0291710 A1* | 11/2008 | Aoki | H02M 7/003 361/689 |
| 2009/0314474 A1 | 12/2009 | Kimbara | |
| 2010/0208427 A1 | 8/2010 | Horiuchi | |
| 2011/0049535 A1 | 3/2011 | Soeno | |
| 2011/0188204 A1* | 8/2011 | Horiuchi | H05K 7/20927 29/527.1 |
| 2013/0206371 A1 | 8/2013 | Fujita | |
| 2014/0043765 A1 | 2/2014 | Gohara | |
| 2014/0239486 A1 | 8/2014 | Takeshi | |
| 2014/0347818 A1 | 11/2014 | Uhlemann | |
| 2014/0376184 A1 | 12/2014 | Gohara | |
| 2015/0021756 A1* | 1/2015 | Adachi | H01L 23/473 257/714 |
| 2015/0122465 A1 | 5/2015 | Mori | |
| 2016/0099194 A1 | 4/2016 | Gohara | |
| 2016/0293518 A1 | 10/2016 | Gohara | |

FOREIGN PATENT DOCUMENTS

| | | |
|---|---|---|
| JP | 2004281484 A | 10/2004 |
| JP | 2005191502 A | 7/2005 |
| JP | 2007221153 A | 8/2007 |
| JP | 2008294067 A | 12/2008 |
| JP | 2010192708 A | 9/2010 |
| JP | 2011177004 A | 9/2011 |
| JP | 2013058518 A | 3/2013 |
| JP | 5206102 B2 | 6/2013 |
| JP | 2015090905 A | 5/2015 |
| JP | 2017084978 A | 5/2017 |
| WO | 2006118032 A1 | 11/2006 |
| WO | 2013054887 A1 | 4/2013 |
| WO | 2013157467 A1 | 10/2013 |
| WO | 2014069174 A1 | 5/2014 |
| WO | 2015093169 A1 | 6/2015 |
| WO | 2015178064 A1 | 11/2015 |

OTHER PUBLICATIONS

U.S. Appl. No. 16/281,059, filed Feb. 20, 2019, to Nobuhide Arai.

* cited by examiner

COOLING APPARATUS, SEMICONDUCTOR MODULE, AND VEHICLE

CROSS-REFERENCE TO RELATED APPLICATIONS

This application is a continuation of U.S. patent application Ser. No. 16/281,059, filed on Feb. 20, 2019, the entirety of which is incorporated herein by reference. The application also claims priority from the following Japanese patent application, which is explicitly incorporated herein by reference:

No. 2018-070713, filed in JP on Apr. 2, 2018.

BACKGROUND

1. Technical Field

The present invention relates to a cooling apparatus, a semiconductor module, and a vehicle.

2. Related Art

In the prior art, it is known that a cooling apparatus is provided in a semiconductor module including semiconductor elements such as a power semiconductor chip or the like (for example, see Patent Documents 1-8).
Patent Document 1: WO 2014/69174
Patent Document 2: WO 2013/157467
Patent Document 3: WO 2015/178064
Patent Document 4: Japanese Patent Application Publication No. 2017-84978
Patent Document 5: WO 2015/93169
Patent Document 6: WO 2013/54887
Patent Document 7: WO 2006/118032
Patent Document 8: Japanese Patent 5206102

SUMMARY

A cooling apparatus preferably has a high cooling performance.

To solve the above-mentioned issue, provided is a semiconductor module including a cooling apparatus and a semiconductor device mounted on the cooling apparatus. The cooling apparatus may include a cooling fin arranged below the semiconductor device. The cooling apparatus may include a main-body portion flow channel through which a coolant flows in a predetermined direction to cool the cooling fin. The cooling apparatus may include a first coolant flow channel that is connected to one side of the main-body portion flow channel and has a first inclined portion upwardly inclined toward the main-body portion flow channel. The cooling apparatus may further include a conveying channel that, when seen from above, lets the coolant into the first coolant flow channel from a direction perpendicular to the predetermined direction or lets the coolant out of the first coolant flow channel in the direction perpendicular to the predetermined direction.

The cooling apparatus may further include a second coolant flow channel that is connected to another side of the main-body portion flow channel and has a second inclined portion upwardly inclined toward the main-body portion flow channel. The conveying channel may let the coolant into or out of the first coolant flow channel from an outside of the cooling fin in the predetermined direction. The conveying channel may let the coolant into or out of the first coolant flow channel from below the cooling fin. The conveying channel may let the coolant into or out of the first coolant flow channel from below the main-body portion flow channel. When seen from above, the first coolant flow channel may overlap with at least a part of the cooling fin. When seen from above, an overlap width in the predetermined direction between the first coolant flow channel and the cooling fin may be substantially constant in the direction perpendicular to the predetermined direction. When seen from above, the second coolant flow channel may overlap with at least a part of the cooling fin. When seen from above, an overlap width in the predetermined direction between the second coolant flow channel and the cooling fin may be substantially constant in the direction perpendicular to the predetermined direction. The semiconductor device may include one or more semiconductor chips and one or more circuit boards to which the one or more semiconductor chips are fixed. The cooling apparatus may further include a top plate and a bottom plate arranged substantially in parallel with the top plate. The one or more circuit boards may be fixed to an upper surface of the top plate. The main-body portion flow channel may be formed to include the top plate and the bottom plate. When seen from above, the main-body portion flow channel may have a substantially rectangular shape. One side of the first coolant flow channel may be provided at least in an area facing the one or more semiconductor chips in the predetermined direction, wherein the one side is closer to the main-body portion flow channel. An opposite side of the first coolant flow channel may be provided at least below the main-body portion flow channel, wherein the opposite side is farther away from the main-body portion flow channel. The cooling fin may be connected to a lower surface of the top plate. The cooling fin may be spaced apart from an upper surface of the bottom plate. At least one semiconductor chip among the one or more semiconductor chips may be positioned such that a straight line given by extending the first inclined portion intersects the at least one semiconductor chip. The cooling fin may be configured with columnar structures connected to the lower surface of the top plate, wherein the columnar structures are arranged in a predetermined pattern. The cooling fin may be configured with at least partly plate-shaped structures connected to the lower surface of the top plate, wherein the at least partly plate-shaped structures are arranged in a predetermined pattern. The cooling fin may be configured with plate-shaped structures arranged substantially parallel to the top plate and provided with an opening through which the coolant flows. When seen from above, a fin region in which the cooling fin is provided may have a substantially rectangular shape, and the fin region may extend from the first coolant flow channel to the second coolant flow channel.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be construed as limiting the claimed invention. Also, all the combinations of the features described in the embodiments are not necessarily essential for means provided by aspects of the invention.

Figure 1:
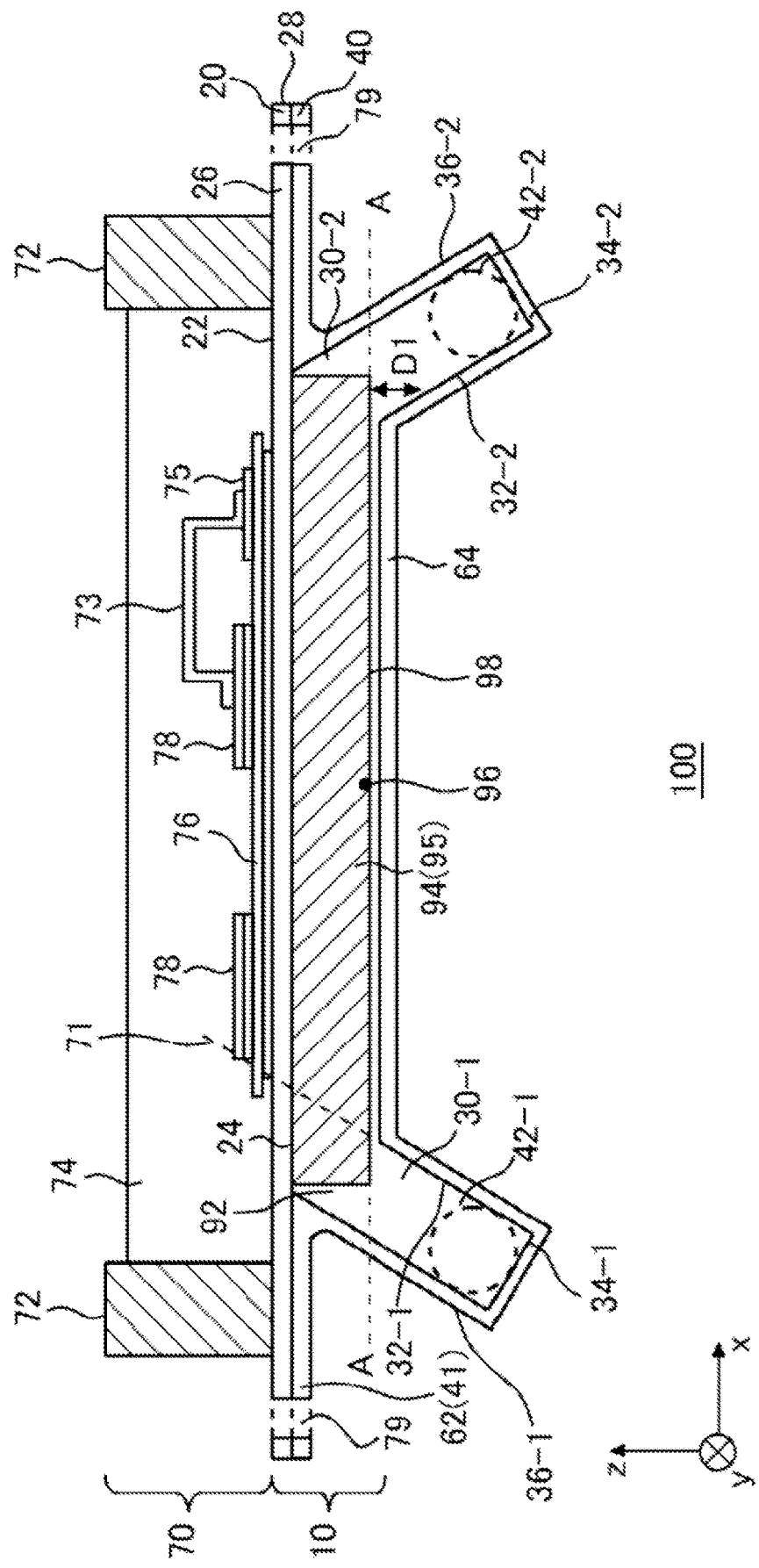
FIG. 1 is a cross-sectional view schematically illustrating one example of a semiconductor module 100 according to one embodiment of the present invention.

FIG. 1 is a cross-sectional view schematically illustrating one example of a semiconductor module 100 according to one embodiment of the present invention. The semiconductor module 100 includes a semiconductor device 70 and a cooling apparatus 10. The semiconductor device 70 in the present example is placed on the cooling apparatus 10. In this specification, the plane of the cooling apparatus 10 on which the semiconductor device 70 is placed is defined as an x-y plane, and the axis perpendicular to the x-y plane is defined as a z axis. In this specification, although the direction from the cooling apparatus 10 toward the semiconductor device 70 in the z-axis direction is referred to as an upper direction and the direction opposite to the upper direction is referred to as a lower direction, the upper and lower directions are not limited to the gravitational direction. Also, in this specification, the surface of surfaces of each member on the upper side is referred to as an upper surface, the surface on the lower side is referred to as a lower surface, and the surface between the upper surface and the lower surface is referred to as a side surface.

The semiconductor device 70 includes one or more semiconductor chips 78 such as a power semiconductor chip. As an example, an insulated gate bipolar transistor (IGBT) formed on a semiconductor substrate made of silicon or the like is provided on each semiconductor chip 78. In the semiconductor chip 78, the insulated gate bipolar transistor and a free wheeling diode (FWD) may be provided on the same substrate.

The semiconductor device 70 has a circuit board 76 and an accommodating portion 72. As an example, the circuit board 76 is a substrate with a circuit pattern provided on an insulating substrate. The semiconductor chips 78 are fixed on the circuit board 76 via solder or the like.

A pad portion 75 formed of a conductive material such as copper may be provided on the circuit board 76. A lead frame 73 connecting the semiconductor chip 78 with the pad portion 75 may be provided on the circuit board 76. The lead frame 73 is a plate-shaped wiring formed of a conductive material such as aluminum. The lead frame 73 may be connected to the semiconductor chip 78 and the pad portion 75 with solder or the like. The pad portion 75 may be connected to other conductive members with a wire or the like.

The accommodating portion 72 is formed of an insulating material such as resin. The accommodating portion 72 has an internal space accommodating the semiconductor chips 78, the circuit board 76, the lead frame 73, and the other circuit elements. The internal space of the accommodating portion 72 may be filled with a sealing portion 74 sealing the semiconductor chips 78, the circuit board 76, and the lead frame 73. The sealing portion 74 is an insulating member such as silicone gel or epoxy resin to name a few.

The cooling apparatus 10 has a top plate 20 and a casing portion 40. The top plate 20 may be a plate-shaped metal plate having an upper surface 22 and a lower surface 24 which are parallel to the x-y plane. The top plate 20 may have two short sides 26 facing each other and two long sides 28 facing each other. The short sides 26 may be parallel to the x-axis direction and the long sides may be parallel to the y-axis direction. As an example, the top plate 20 is formed of a metal containing aluminum. The semiconductor device 70 is placed on the upper surface 22 of the top plate 20. Heat generated by the semiconductor chips 78 is transferred to the top plate 20. For example, thermal conductive member such as the circuit board 76, a metal plate, and solder are arranged between the top plate 20 and the semiconductor chip 78. The circuit board 76 may be fixed directly on the upper surface 22 of the top plate 20 with solder or the like. In this case, the accommodating portion 72 is provided so as to surround the region in which the circuit board 76 and the like are arranged on the upper surface 22 of the top plate 20. For other examples, the semiconductor device 70 may have a metal plate exposed on the lower surface of the accommodating portion 72, the circuit board 76 may be fixed on the upper surface of the metal plate, and the metal plate may be fixed on the upper surface 22 of the top plate 20.

The casing portion 40 includes a coolant circulation portion 92 and an outer edge portion 41 surrounding the coolant circulation portion 92 in the x-y plane. The coolant circulation portion 92 is arranged under the lower surface 24 of the top plate 20. The coolant circulation portion 92 is a region in which a coolant such as water circulates. The coolant circulation portion 92 may be a sealed space in contact with the lower surface 24 of the top plate 20. Also, the casing portion 40 is closely attached, directly or indirectly, to the lower surface 24 of the top plate 20 at the outer edge portion 41 surrounding the coolant circulation portion 92 in the x-y plane. In this manner, the coolant circulation portion 92 is sealed. Note that being closely attached indirectly to each other refers to the state where the lower surface 24 of the top plate 20 and the casing portion 40 are closely attached to each other via a sealing material, an adhesive agent, or the other members provided between the lower surface 24 of the top plate 20 and the casing portion 40. Being closely attached to each other refers to the state where the coolant inside the coolant circulation portion 92 does not leak from the closely attaching part. A cooling fin 94 is arranged inside the coolant circulation portion 92. The cooling fin 94 may be connected to the lower surface 24 of the top plate 20. The heat generated by the semiconductor chips 78 is transferred to the coolant by allowing the coolant to pass through the vicinity of the cooling fin 94. In this manner, the semiconductor device 70 can be cooled.

The cooling fin 94 has a configuration in which columnar or plate-shaped structures provided approximately perpendicular to the x-y plane may be arranged in the x-y plane in a predetermined pattern. For other examples, the cooling fin 94 has a configuration in which plate-shaped structures which are provided approximately parallel to the x-y plane and are each provided with an opening serving as a flow channel for the coolant may be stacked in the z-axis direction. Note that the configuration of the cooling fin 94 is not limited to these configurations.

In this specification, the region in which the cooling fin 94 is provided is referred to as a fin region 95. When seen from above, the fin region 95 may has a rectangular form, and may have two short sides facing each other and parallel to the x-axis direction and two long sides facing each other and parallel to the y-axis direction. The fin region 95 includes a region in which the structures of the cooling fin 94 are provided and flow channels for the coolant formed between the structures of the cooling fin 94.

The casing portion 40 in the present example has a frame portion 62 and a main-body portion 64. The outer edge portion 41 may include at least the frame portion 62. The frame portion 62 is arranged so as to surround the coolant circulation portion 92 in the x-y plane. The frame portion 62 is closely attached, directly or indirectly, to the lower surface 24 of the top plate 20. In other words, the frame portion 62 and the lower surface 24 of the top plate 20 are provided so as to seal the coolant circulation portion 92. A sealing material or other members may be provided between the frame portion 62 and the lower surface 24 of the top plate 20.

For the present example, the top plate 20 and the casing portion 40 are brazed together. As an example, the top plate 20 is formed of a metal having the same composition as the metal the casing portion 40 is formed of, and the brazing material is formed of a metal having a lower melting temperature than the metal the top plate 20 and the like are formed of. As the metal, a metal containing aluminum may be used.

The main-body portion 64 is arranged so as to have the coolant circulation portion 92 between the lower surface 24 of the top plate 20 and the main-body portion 64. The frame portion 62 in the present example is a portion of the casing portion 40 closely attached to the lower surface 24 of the top plate 20, and the main-body portion 64 in the present example is a portion of the casing portion 40 away from the lower surface 24 of the top plate 20. With the main-body portion 64 being arranged away from the lower surface 24 of the top plate 20, the coolant circulation portion 92 is formed.

The top plate 20 and the casing portion 40 are provided with through holes 79 into which a screw or the like is inserted for fastening them. The through holes 79 may be also used to fix the semiconductor module 100 to an external apparatus. The through holes 79 are provided in the regions in which the top plate 20 and the frame portion 62 are closely attached, directly or indirectly, to each other and stacked in the z-axis direction.

The cooling fin 94 is arranged inside the coolant circulation portion 92. An upper end of the cooling fin 94 may be connected to the lower surface 24 of the top plate 20. A lower end 98 of the cooling fin 94 and the main-body portion 64 may or may not be in contact with each other.

Inside the coolant circulation portion 92, a first coolant flow channel 30-1 and a second coolant flow channel 30-2 are provided, which are arranged, when seen from above (when seen from above in the z-axis direction perpendicular to the x-y plane, in the present example), so as to sandwich the cooling fin 94 therebetween. The first coolant flow channel 30-1 and the second coolant flow channel 30-2 in the present example sandwich the cooling fin 94 therebetween in the x-axis direction. Also, the respective coolant flow channels 30 extend along the cooling fin 94 in the y-axis direction (the longitudinal direction).

The main-body portion 64 is provided with openings 42 at the positions corresponding to the respective coolant flow channels 30. One of the openings 42 serves as an inlet to let the coolant in to the coolant flow channel 30 and the other serves as an outlet to let the coolant out of the coolant flow channel 30. A user can appropriately select which of the openings 42 to use as which of the inlet and the outlet. Although a first opening 42-1 corresponding to the first coolant flow channel 30-1 serves as the inlet, and a second opening 42-2 corresponding to the second coolant flow channel 30-2 serves as the outlet in this specification, the functions of the respective openings 42 may be reversed.

The first coolant flow channel 30-1 and the second coolant flow channel 30-2 are each at least partly provided below the cooling fin 94. The coolant flow channels 30 refer to spaces having a height (a length in the z-axis direction) more than or equal to a predetermined height inside the coolant circulation portion 92. The predetermined height may be a distance between a lower end 98 of the cooling fin 94 and the main-body portion 64, at a center position 96 of the cooling fin 94 in the x-y plane. In this regard, however, the flow channels formed between the structures of the cooling fin 94 are not included in the coolant flow channels 30.

A space may be provided between the lower end 98 of the cooling fin 94 and the main-body portion 64. In this manner, generation of stresses between the cooling fin 94 and the main-body portion 64 can be prevented even if warpage or the like of the main-body portion 64 is generated. For other examples, the lower end 98 of the cooling fin 94 may be in contact with the main-body portion 64.

Each of the first coolant flow channel 30-1 and the second coolant flow channel 30-2 has a flow channel bottom surface. The flow channel bottom surface is a surface which is in contact with the coolant and faces upward. The flow channel bottom surface in the present example has an inclined portion 32 and a bottom portion 34. The smaller the distance between a position on the inclined portions 32 and the center position 96 of the fin region 95 in the x-axis direction is, the smaller the distance D1 between the position on the inclined portions 32 and the lower end 98 of the cooling fin 94 in the z-axis direction is. For example, the value of the z coordinate of a position on the inclined portions 32-1, which is arranged on the negative side in the x-axis direction and the negative side in the z-axis direction relative to the cooling fin 94, increases in the positive direction as the value of the x coordinate of the position increases in the positive direction. Also, the value of the z coordinate of a position on the inclined portions 32-2, which is arranged on the positive side in the x-axis direction and the negative side in the z-axis direction relative to the cooling fin 94, increases in the positive direction as the value of the x coordinate of the position increases in the negative direction.

Also, the inclined portion 32 of each of the first coolant flow channel 30-1 and the second coolant flow channel 30-2 is at least partly provided below the cooling fin 94. The inclined portion 32 of at least one of the first coolant flow channel 30-1 and the second coolant flow channel 30-2 may be wholly provided below the cooling fin 94. Also, each of the openings 42 is arranged near the lower end of the inclined portion 32 in the z-axis direction.

Providing the inclined portions 32 in this way enables the coolant let in through any one of the openings 42 to flow toward the lower end 98 of the cooling fin 94. Accordingly, the coolant can be efficiently delivered to the region near the top plate 20 in the cooling fin 94, and the semiconductor device 70 can be cooled efficiently.

In particular, when the space is provided between the lower end 98 of the cooling fin 94 and the main-body portion 64 as illustrated in FIG. 1, the coolant flows into the space, resulting in low cooling efficiency of the semiconductor device 70. With the present example, the coolant can be delivered to the region near the top plate 20 to cool the semiconductor device 70.

Note that a straight line 71 given by extending the inclined portion 32 in the x-z cross section may intersect the semiconductor chip 78. Also, the straight line 71 may intersect the pad portion 75 connected to the semiconductor chip 78 with the lead frame 73. In this manner, the coolant easily flows toward the heat source, so that the semiconductor device 70 can be cooled efficiently.

The bottom portion 34 is a surface connected to the inclined portion 32. The bottom portion 34 may be inclined relative to the x axis in the reverse direction to the direction in which the inclined portions 32 is inclined, or may be parallel to the x axis. Also, the main-body portion 64 may have the side walls 36. Each of the side walls 36 connects the bottom portion 34 and the frame portion 62. The side walls 36 may be provided so as to be parallel to the inclined portions 32 in the x-z plane. This makes it even easier for the coolant let in through the opening 42 to flow toward the lower end 98 of the cooling fin 94. In this regard, however, the side walls 36 may be provided so as to be nonparallel to the inclined portions 32 in the x-z plane.

Figure 2:
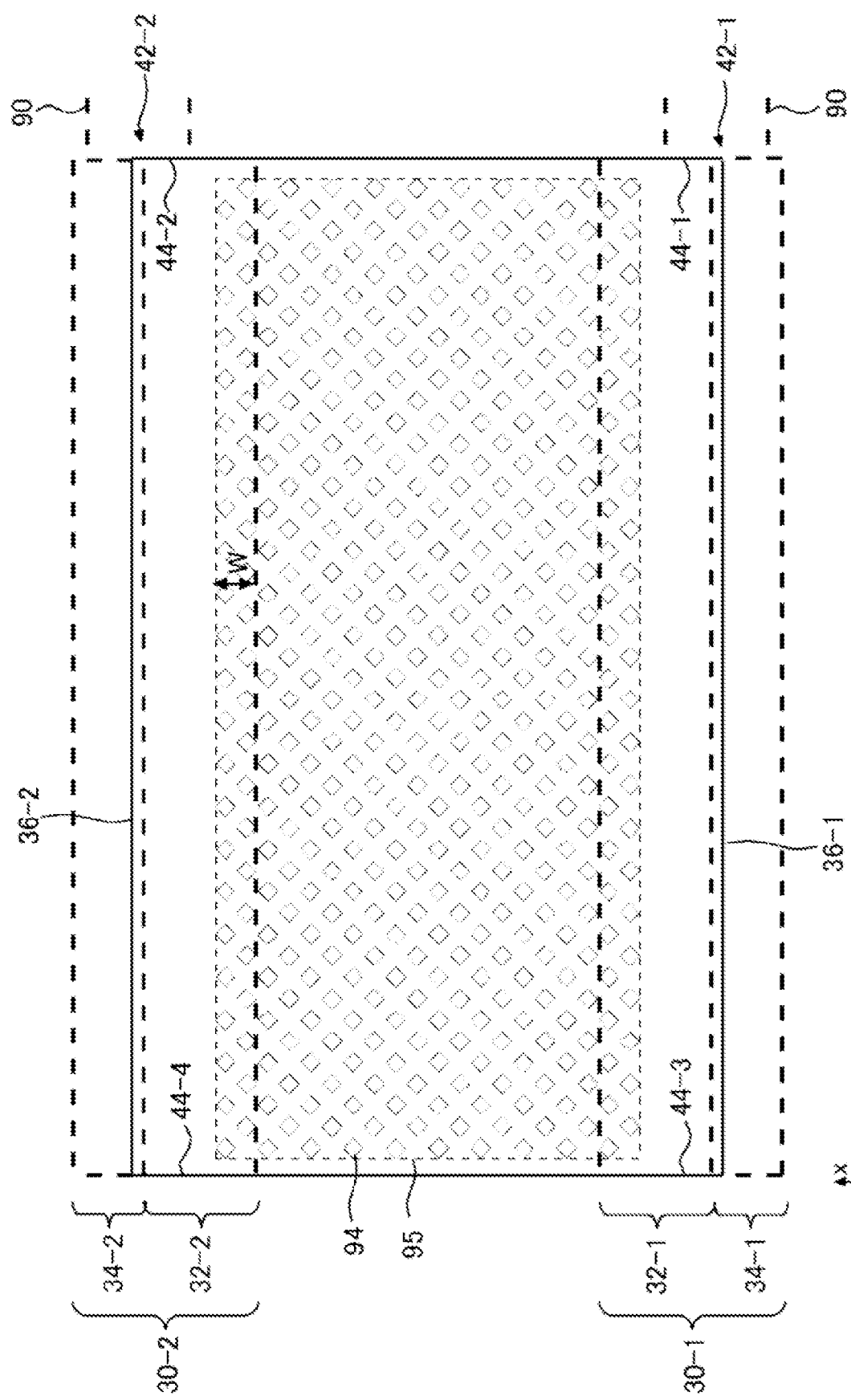
FIG. 2 is a diagram illustrating an arrangement example of a cooling fin 94, a first coolant flow channel 30-1, and a second coolant flow channel 30-2 in the x-y plane.

FIG. 2 is a diagram illustrating an arrangement example of the cooling fin 94, the first coolant flow channel 30-1, and the second coolant flow channel 30-2 in the x-y plane. In FIG. 2, the first coolant flow channel 30-1 and the second coolant flow channel 30-2 are projected on the plane parallel to the lower end 98 of the cooling fin 94 (A-A plane in FIG. 1). In FIG. 2, the positions of the inclined portions 32 and the bottom portions 34 in the plane are illustrated with dotted lines. Also, the positions of the side walls 36 in the plane are illustrated with solid lines. Although the cooling fin 94 illustrated in FIG. 2 has rod-shaped structures arranged discretely in the x-y plane, the configuration of the cooling fin 94 is not so limited.

In this specification, each of the coolant flow channels 30 extends along the cooling fin 94 in the longitudinal direction (the y-axis direction). Also, the direction parallel to the lower surface 24 of the top plate 20 and perpendicular to the longitudinal direction (the y-axis direction) is defined as the width direction (the x-axis direction). The cooling fin 94 may be arranged such that the longitudinal direction of the fin region 95 is parallel to the y-axis direction. In other words, the longitudinal direction and the two long sides of the fin region 95 may be mutually parallel.

Each of the coolant flow channels 30 has two ends 44 in the y-axis direction. In FIG. 2, the first coolant flow channel 30-1 has a first end 44-1 and a third end 44-3, and the second coolant flow channel 30-2 has a second end 44-2 and a fourth end 44-4. The first end 44-1 and the second end 44-2 are ends on the same side, and the third end 44-3 and the fourth end 44-4 are ends on the same side. The same side refers to the relative positions of two ends 44 of one coolant flow channel in they axis. For example, the first end 44-1 is arranged on the positive side in the y-axis direction relative to the third end 44-3, and the second end 44-2 is arranged on the positive side in the y-axis direction relative to the fourth end 44-4. In other words, the first end 44-1 and the second end 44-2 are both arranged on the positive side in the y-axis direction. When seen from above, the longitudinal directions of the first coolant flow channel 30-1 and the second coolant flow channel 30-2 may be parallel to each other in the y-axis direction, and may be parallel also to the long sides of the fin region 95 and the long sides of the top plate 20.

The first opening 42-1 is provided on an end side corresponding to the first end 44-1 of the first coolant flow channel 30-1. Also, the second opening 42-2 is provided on an end side corresponding to the second end 44-2 of the second coolant flow channel 30-2. In other words, the two openings 42 are provided, in the casing portion 40, on the same side of the coolant flow channels 30. A pipe 90 conveying the coolant is connected to each of the openings 42. The range of "the end side" will be described later.

As described in FIG. 1, each of the coolant flow channels 30 is arranged so as to overlap the cooling fin 94. To be more specific, each of the coolant flow channels 30 is arranged so as to have a predetermined overlap width W by which it overlaps the fin region 95 in the x-axis direction over the entire length of the fin region 95 in the y-axis direction illustrated with a dotted line in FIG. 2. The overlap width W may be constant regardless of position on the y axis, or may be different depending on positions on the y axis. Also, the overlap width W of the first coolant flow channel 30-1 may be the same as, or may be different from the overlap width W of the second coolant flow channel 30-2.

Figure 3:
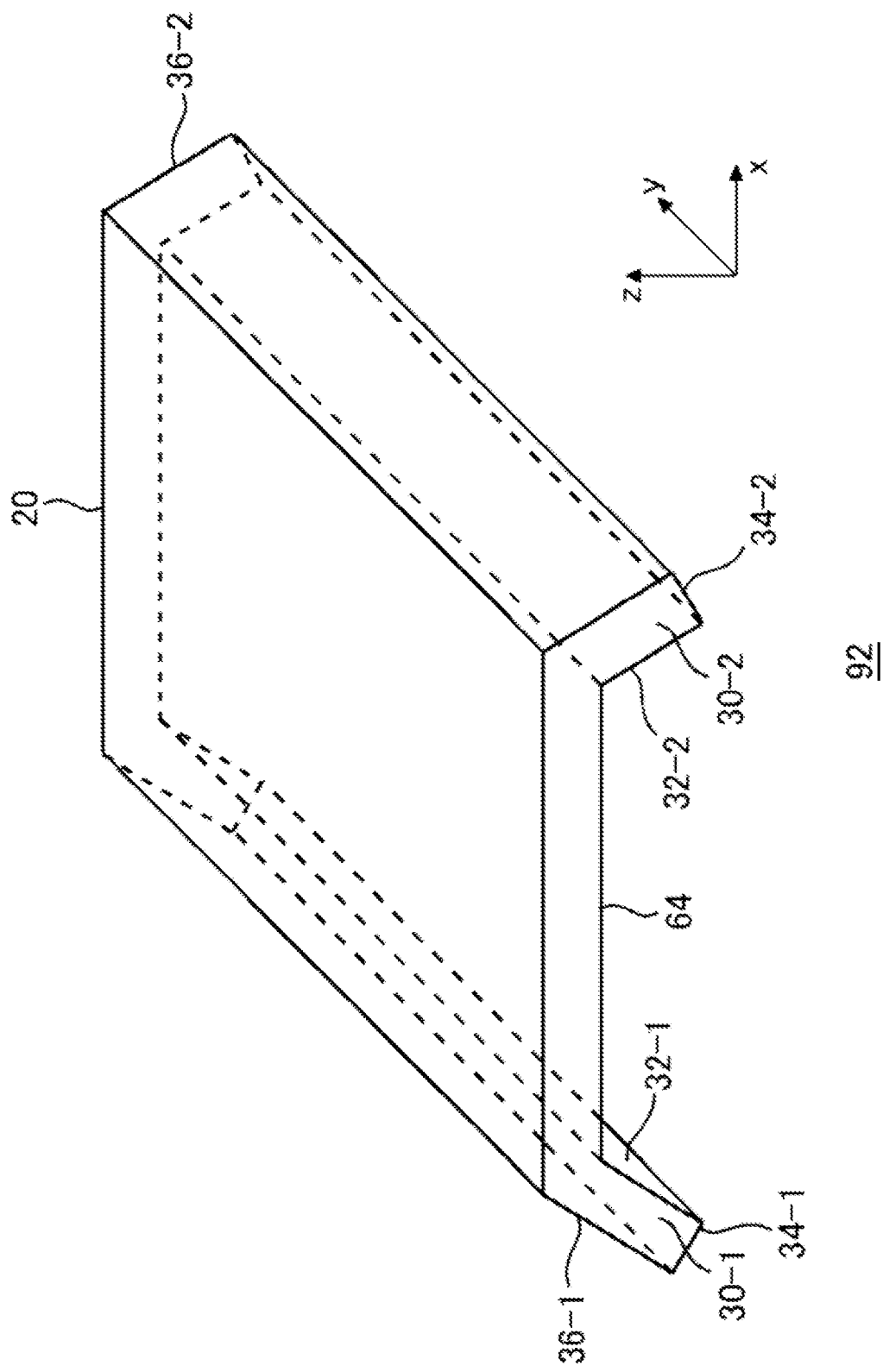
FIG. 3 is a perspective view schematically illustrating a coolant circulation portion 92.

FIG. 3 is a perspective view schematically illustrating the coolant circulation portion 92. As described in FIG. 1 and FIG. 2, the coolant circulation portion 92 has the coolant flow channels 30 extending in the y-axis direction at the both ends of the x-axis direction. Each of the coolant flow channels 30 have the inclined portion 32, where the value of the z coordinate of a position on the inclined portion 32 gradually increases from an outer side toward an inner side in the x-axis direction. The outer side in the x-axis direction refers to the side far from the center of the coolant circulation portion 92 in the x-axis direction, and the inner side refers to the side close to the center of the coolant circulation portion 92. The respective inclined portions 32 in the example of FIG. 3 are provided so as to extend over the entire length of the coolant circulation portion 92 in the y-axis direction.

Figure 4:
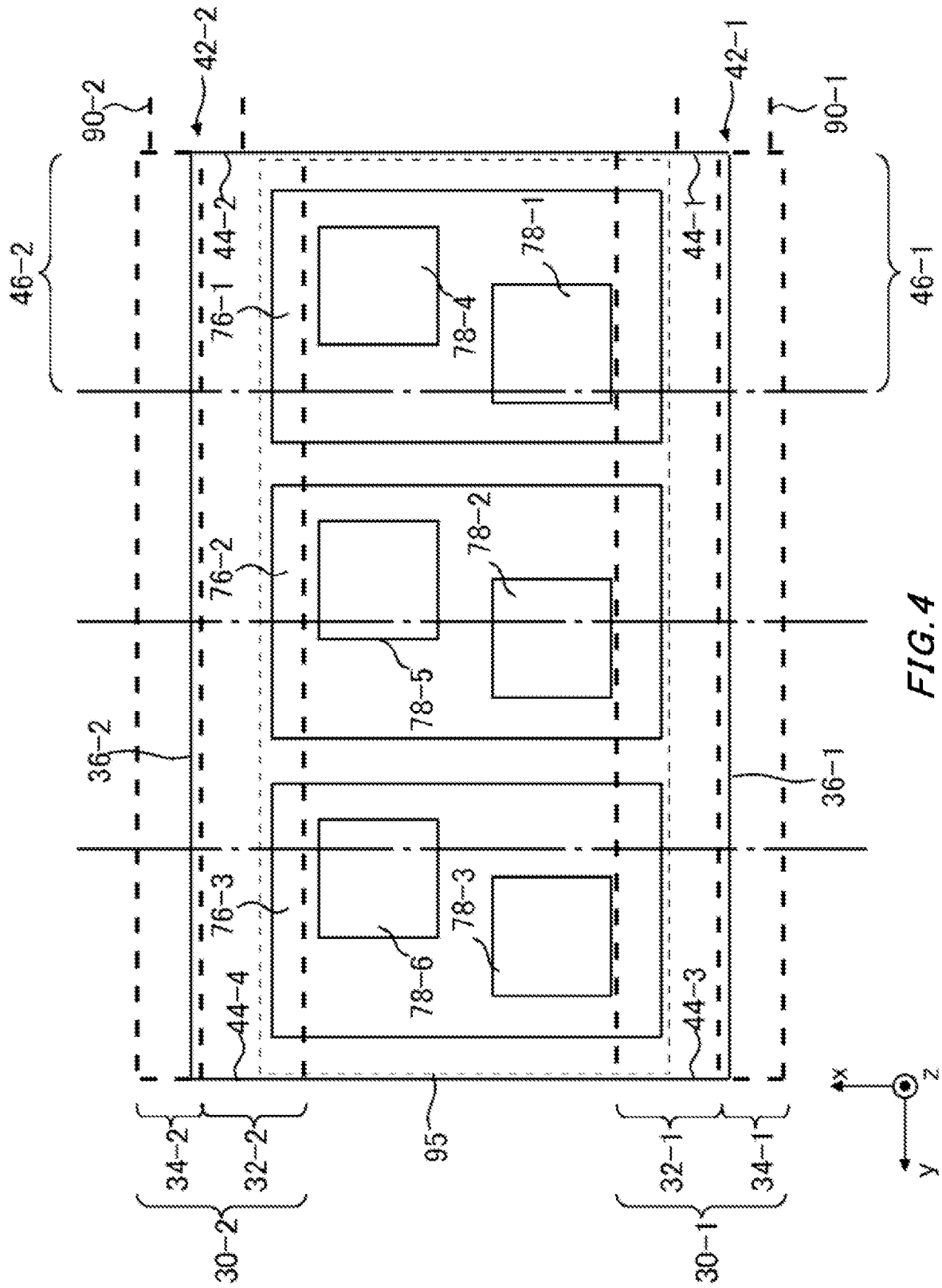
FIG. 4 is a diagram illustrating end side regions 46.

FIG. 4 is a diagram illustrating end side regions 46. As described above, the first opening 42-1 is arranged on an end side region 46-1 which is the region on the first end 44-1 side of the first coolant flow channel 30-1. The second opening 42-2 is arranged on an end side region 46-2 which is the region on the second end 44-2 side of the second coolant flow channel 30-2. The end side region 46-1 is a region of the regions obtained, for example, by quartering the first coolant flow channel 30-1 in the y-axis direction that includes the first end 44-1. The end side region 46-2 is a region of the regions obtained, for example, by quartering the second coolant flow channel 30-2 in the y-axis direction that includes the second end 44-2. The openings 42 are each provided on any surface of the main-body portion 64 surrounding the end side regions 46. The openings 42 may be provided on the surface approximately parallel to the x-z plane as illustrated in FIG. 4, may be provided on the surfaces approximately parallel to the x-y plane (i.e., bottom surface), or may be provided on the surfaces approximately parallel to the y-z plane.

Also, in FIG. 4, the positions of the semiconductor chips 78 in the x-y plane are illustrated with solid lines. For the present example, the plurality of semiconductor chips 78 are arrayed in the y-axis direction along the respective coolant flow channels 30. The end side region 46-1 in the y-axis direction may extend from the position of the semiconductor chip 78-1 arranged closest to the first end 44-1 in the y-axis direction to the position of the first end 44-1 in the y-axis direction. The end side region 46-2 in the y-axis direction may extend from the position of the semiconductor chip 78-4 arranged closest to the second end 44-2 in the y-axis direction to the position of the second end 44-2 in the y-axis direction. The positions of the openings 42 may overlap the positions of the semiconductor chips 78 in the y-axis direction.

Note that each of the coolant flow channels 30 is provided at least in an area facing, in the x-y plane, the semiconductor chips 78. In the present example, the area facing the semiconductor chips 78 includes the area facing, in the x-axis direction, the semiconductor chips 78 arranged on the both ends in the y-axis direction (for example, the semiconductor chips 78-1 and 78-3 for the first coolant flow channel 30-1) and the area facing, in the x-axis direction, the region located between these semiconductor chips 78. Similarly, the inclined portion 32 is provided at least in an area facing, in the x-y plane, the semiconductor chips 78. In this manner, efficient flow of the coolant can be provided for the semiconductor chips 78 which generate heat. In the example illustrated in FIG. 4, the respective coolant flow channel 30 and inclined portions 32 are provided so as to extend over the entire length of the coolant circulation portion 92 in the y-axis direction.

Figure 5:
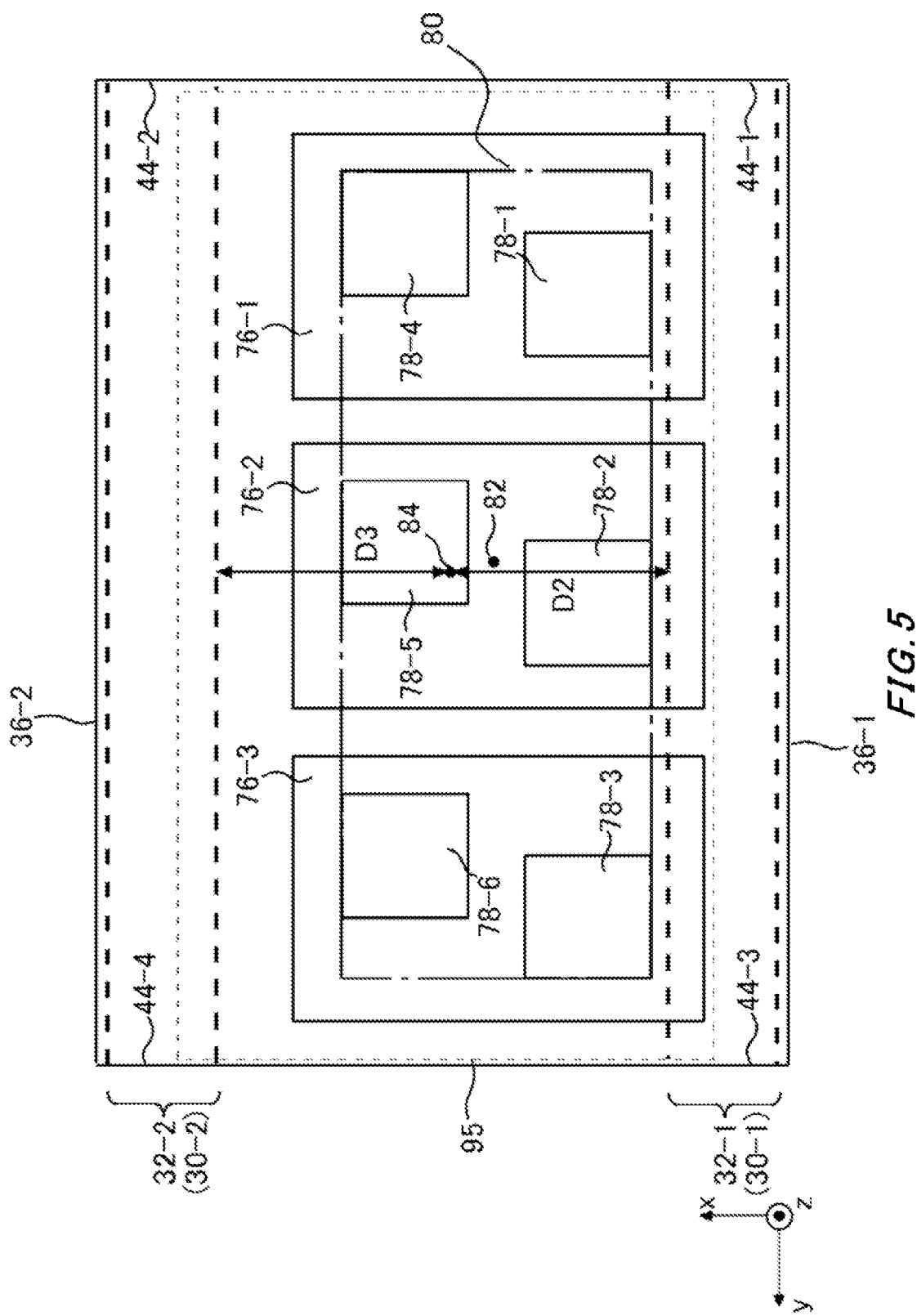
FIG. 5 is a diagram illustrating an arrangement example of semiconductor chips 78 and a fin region 95.

FIG. 5 is a diagram illustrating an arrangement example of the semiconductor chips 78 and the fin region 95. The structural features other than the arrangement of the semiconductor chips 78 and the fin region 95 are similar to those for the examples described in FIG. 1 to FIG. 4.

In the present example, the plurality of semiconductor chips 78 are provided in different positions in the x-axis direction. As an example, the semiconductor chips 78-1, 78-2, and 78-3 are arranged at the different positions in the x-axis direction from where the semiconductor chips 78-4, 78-5, and 78-6 are arranged. The region in which the plurality of the semiconductor chips 78 are provided is defined as a chip region 80. The chip region 80 is a rectangular region having the sides parallel to the x axis and the sides parallel to the y axis that circumscribe the plurality of the semiconductor chips 78. The central position of the chip region 80 in the x-axis direction is a center position 82. Also, the central position of the fin region 95 in the x-axis direction is a center position 84.

In the present example, the center position 82 of the chip region 80 is arranged closer to the first coolant flow channel 30-1 than the center position 84 of the fin region 95 is located. Such an arrangement enables the semiconductor chips 78-4, 78-5, and 78-6 to be arranged closer to the first coolant flow channel 30-1. When the coolant is let in from the first end 44-1 side and let out of the second end 44-2 side, the temperature of the coolant in the region near the second end 44-2 is relatively high. Therefore, heat emitted by the semiconductor chip 78-4 or the semiconductor chip 78-5 near the second end 44-2 may not be dissipated sufficiently. With the arrangement in the present example, the semiconductor chip 78-4 and the semiconductor chip 78-5 can be arranged in the region in which the temperature of the coolant is relatively low, promoting dissipation of heat emitted by the semiconductor chip 78-4 or the semiconductor chip 78-5.

Note that a partial region of the semiconductor chip 78-4 which is closest to the second end 44-2 may be arranged closer, in the x-axis direction, to the first coolant flow channel 30-1 than the center position 84 of the fin region 95 is located. Also, a distance D2 between the center position 84 of the fin region 95 and the first coolant flow channel 30-1 in the x-axis direction may be smaller than or equal to the distance D3 between the center position 84 and the second coolant flow channel 30-2 in the x-axis direction. Also, the distance D2 may be greater than the distance D3. Note that the inclined portions 32 may be illustrated as the coolant flow channels 30 in the diagrams of FIG. 5 and the like.

Figure 6:
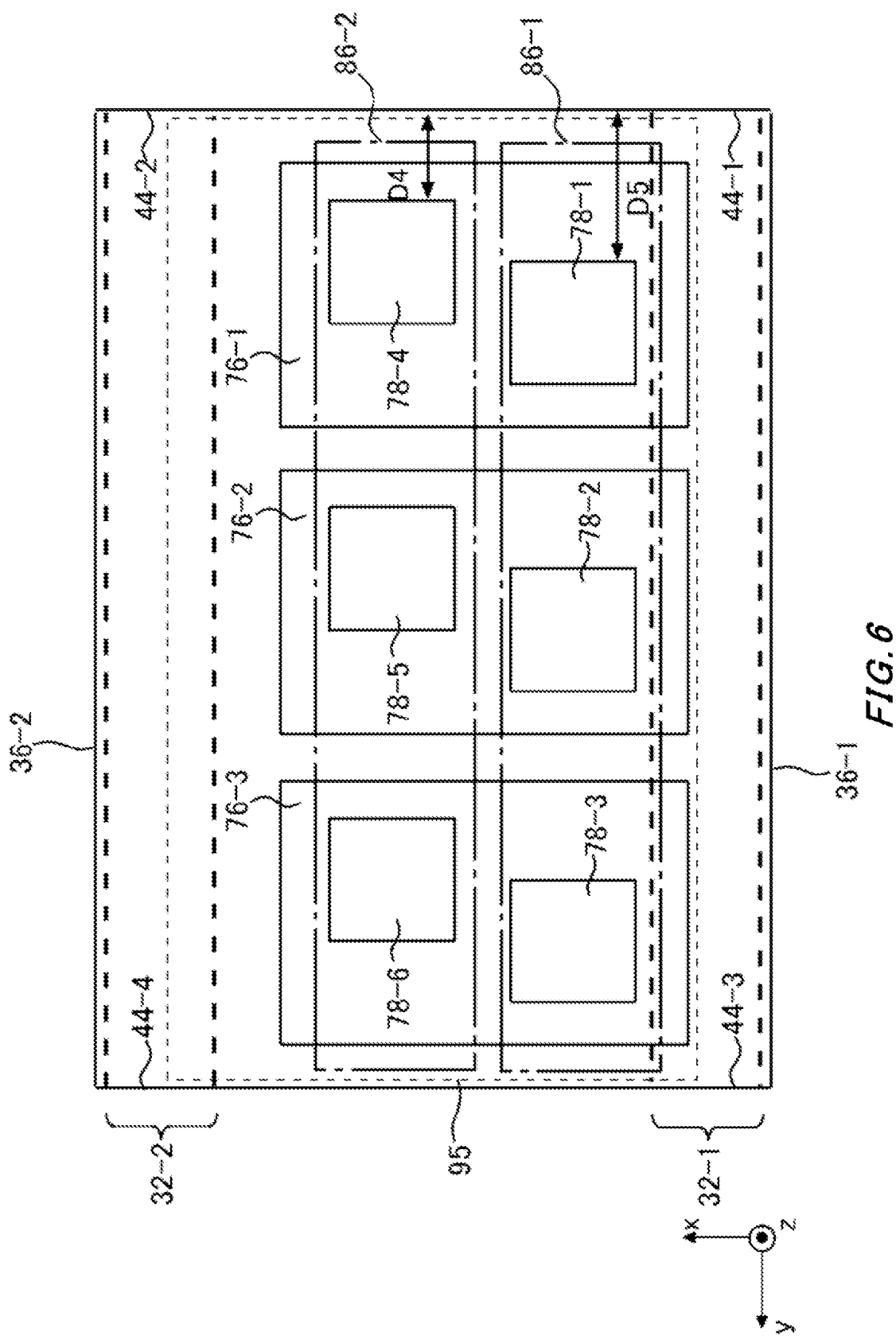
FIG. 6 is a diagram illustrating an arrangement example of the semiconductor chips 78 in the y-axis direction.

FIG. 6 is a diagram illustrating an arrangement example of the semiconductor chips 78 in the y-axis direction. An arrangement of the semiconductor chips 78 in the y-axis direction described in the present example may be applied to the respective aspects described in FIG. 1 to FIG. 5.

In the present example, the plurality of semiconductor chips 78-1, 78-2, and 78-3 arranged along the first coolant flow channel 30-1 in the y-axis direction constitute a first group of chips 86-1. Also, the plurality of semiconductor chips 78-4, 78-5, and 78-6 arranged along the second coolant flow channel 30-2 in the y-axis direction constitute a second group of chips 86-2.

The distance between the semiconductor chip 78-4 arranged closest to the second end 44-2 in the second group of chips 86-2 and the second end 44-2 in the y-axis direction is defined as D4. Also, the distance between the semiconductor chip 78-1 arranged closest to the first end 44-1 in the first group of chips 86-1 and the first end 44-1 in the y-axis direction is defined as D5. In the present example, the distance D4 is smaller than the distance D5. The flow velocity of the coolant is relatively high in the vicinities of the first end 44-1 and the second end 44-2 at which the openings 42 are provided. The flow velocity of the coolant in the vicinity of the semiconductor chip 78-4 can be made relatively high by reducing the distance D4 between the semiconductor chip 78-4 and the second end 44-2 in the y-axis direction as in the present example. Accordingly, heat from the semiconductor chip 78-4 is easily dissipated.

Figure 7:
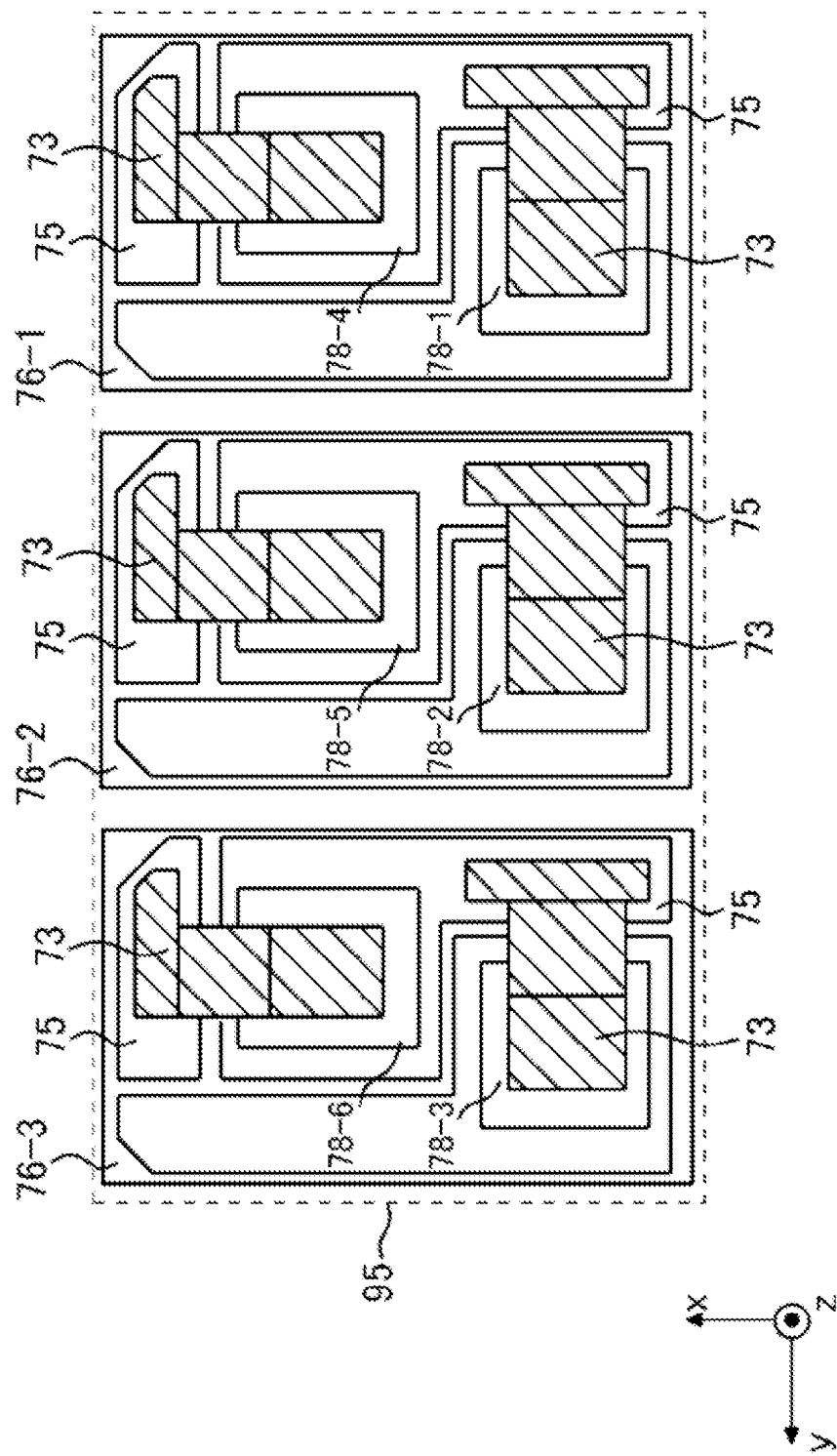
FIG. 7 is a diagram illustrating an arrangement example of a fin region 95 and circuit elements provided on circuit boards 76.

FIG. 7 is a diagram illustrating an arrangement example of the fin region 95 and circuit elements provided on circuit boards 76. In the present example, the center position 82 of the chip region 80 is arranged closer to the first coolant flow channel 30-1 than the center position 84 of the fin region 95 is located, as illustrated in FIG. 5.

The semiconductor chips 78, the lead frames 73, and the pad portions 75 are provided on the circuit boards 76 in the present example. The pad portions 75 are pads connected to the semiconductor chips 78 via the lead frames 73. Therefore, heat from the semiconductor chips 78 are easily transferred to the pad portions 75.

In the present example, the fin region 95 is arranged so as to overlap all of the pad portions 75, when seen from above. In this manner, heat from the pad portions 75 can be efficiently dissipated. Note that the center position 82 of the chip region 80 is arranged closer to the first coolant flow channel 30-1 than the center position 84 of the fin region 95 is located, so that a vacant region is produced between the semiconductor chips 78-4, 78-5, and 78-6 and the second coolant flow channel 30-2 in the circuit boards 76. Arranging pad portions 75 in the vacant region makes it easy to arrange the pad portions 75 above the fin region 95 to cool the pad portions 75. One end of each of the lead frames 73 connected to the semiconductor chips 78-4, 78-5, and 78-6 may be connected to each of the pad portions 75 arranged in the vacant region.

Figure 8:
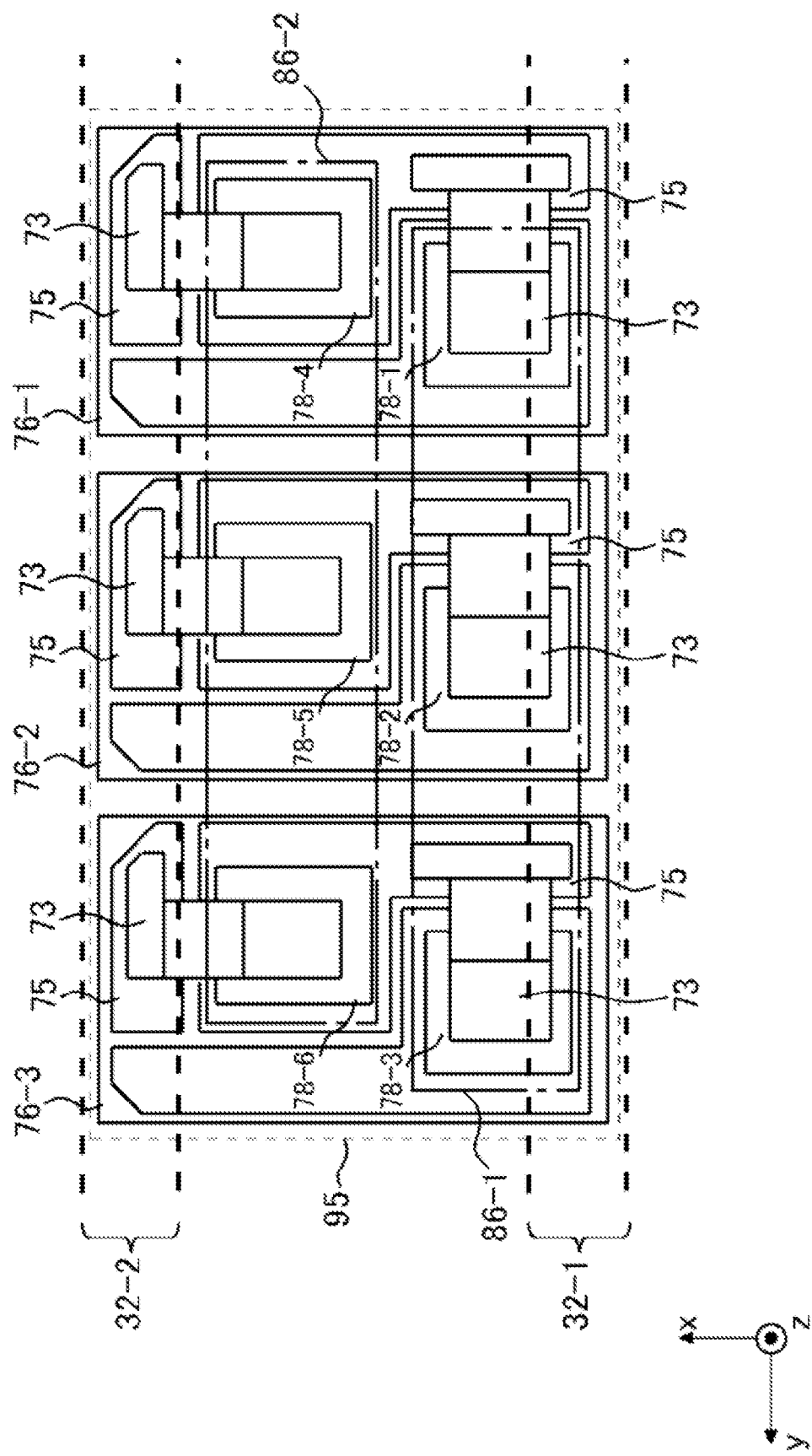
FIG. 8 is a diagram illustrating an arrangement example of the circuit elements provided on the circuit boards 76 and a coolant flow channels 30.

FIG. 8 is a diagram illustrating an arrangement example of the circuit elements provided on the circuit boards 76 and the coolant flow channels 30. At least one of the first coolant flow channel 30-1 and the second coolant flow channel 30-2 may be arranged so as to overlap the first group of chips 86-1 or the second group of chips 86-2 when seen from above. In the example of FIG. 8, the first coolant flow channel 30-1 partially overlaps the first group of chips 86-1. In this manner, the semiconductor chips 78 in the first group of chips 86-1 can be cooled efficiently.

The second coolant flow channel 30-2 may be arranged so as to overlap the pad portions 75 when seen from above as described in FIG. 7. The pad portions 75 are pad portions 75 provided closer to the second coolant flow channel 30-2 than the semiconductor chip 78-4, 78-5, and 78-6. The pad portions 75 may wholly overlap with the second coolant flow channel 30-2 in the x-y plane. Also, the second coolant flow channel 30-2 may overlap the second group of chips 86-2 when seen from above.

Also, the pad portions 75 arranged so as to wholly overlap the coolant flow channel 30 may be greater in thickness in the z-axis direction than the other pad portions 75. This can improve the heat dissipation efficiency.

Also, the fin region 95 may have a tapered region, where the width of the tapered region in the x-axis direction decreases away from the first end 44-1 and the second end 44-2 in the y-axis direction. In this manner, in the region away from the first end 44-1 and the second end 44-2, the resistance applied to the coolant by the cooling fin 94 can be reduced and a uniform flow velocity distribution of the coolant within the x-y plane can be provided.

Figure 9:
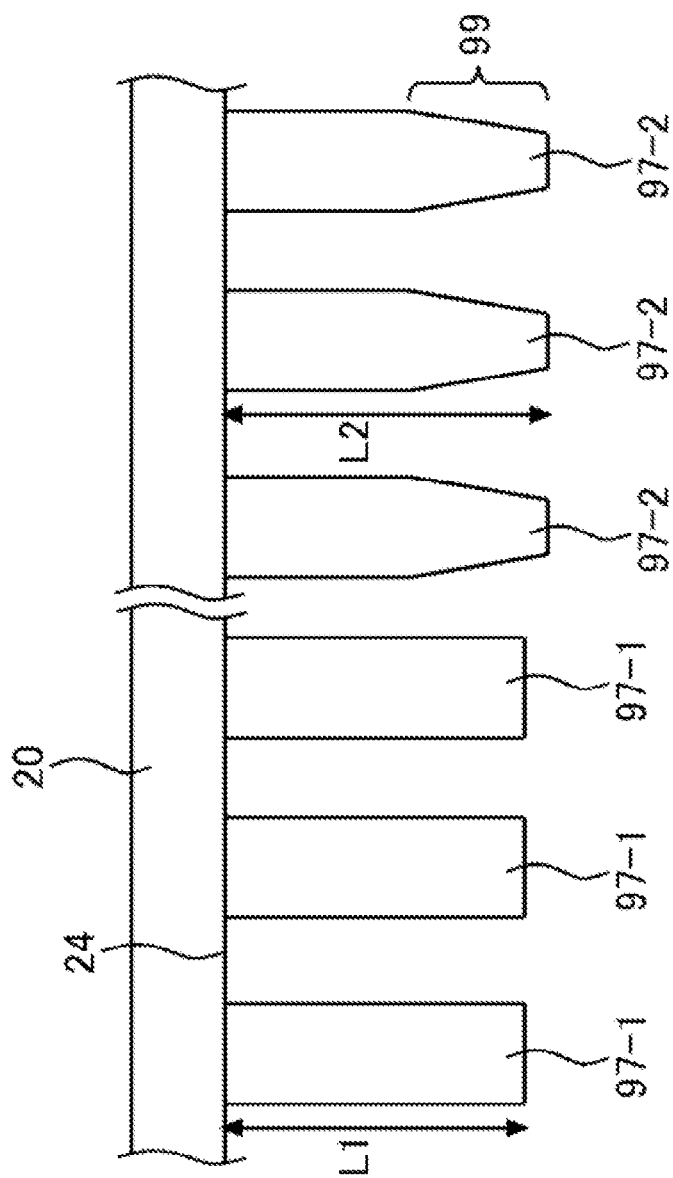
FIG. 9 is a cross-sectional view illustrating one example of protruding portions 97 included in the cooling fin 94.

FIG. 9 is a cross-sectional view illustrating one example of protruding portions 97 included in the cooling fin 94. The cooling fin 94 in the present example includes the plurality of protruding portions 97 extending downward from the top plate 20. The protruding portions 97 may have rod-shaped form or plate-shaped form. At least some of the protruding portions 97-2 each have a tapered portion 99, where the area of the cross section of the tapered portion 99 parallel to the lower surface 24 of the top plate 20 decreases away from the top plate 20 in the downward direction. The tapered portion 99 is provided in the region including the lower end of the protruding portion 97. In the present example, the width of the tapered portion 99 in the x-axis direction decreases away from the top plate 20 in the downward direction. Such a configuration enables the coolant flowing from below the cooling fin 94 to flow to the vicinity of the lower surface 24 of the top plate 20 efficiently.

At least some of the protruding portions 97 which overlap the first coolant flow channel 30-1 or the second coolant flow channel 30-2 when seen from above may be the protruding portions 97-2 having the tapered portion 99. All of the protruding portions 97 which overlap the first coolant flow channel 30-1 and the second coolant flow channel 30-2 may be the protruding portions 97-2.

The protruding portions 97 which do not overlap the first coolant flow channel 30-1 or the second coolant flow channel 30-2 when seen from above may be the protruding portions 97-1 which do not have the tapered portion 99. As an example, the cross-sectional area of the protruding portion 97-1 at its lower end is the same as the cross-sectional area at its upper end in contact with the top plate 20.

In this manner, the coolant can flow to the vicinity of the top plate 20 in the region overlapping the coolant flow channels 30. Also, the coolant easily flows in the direction approximately parallel to the lower surface 24 of the top plate 20 in the region not overlapping the coolant flow channels 30. Note that the length of the protruding portion 97-2 having the tapered portion 99 in the z-axis direction, L2, may be the same as or longer than the length of the protruding portion 97-1 in the z-axis direction, L1.

Figure 10:
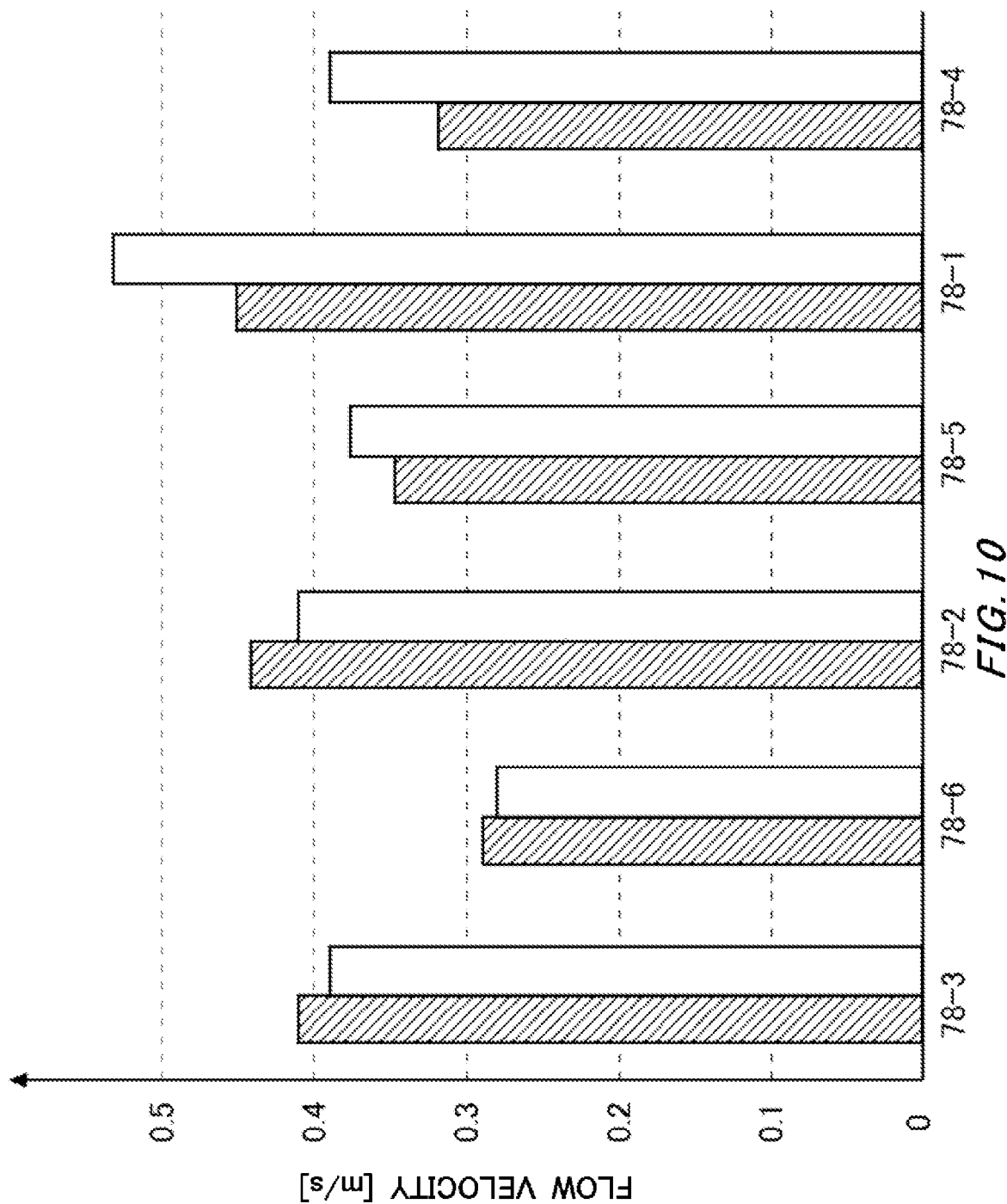
FIG. 10 illustrates an example in which flow velocities of a coolant flowing below the respective semiconductor chips 78 are compared.

FIG. 10 illustrates an example in which flow velocities of the coolant flowing below the respective semiconductor chips 78 are compared. In FIG. 10, the graphs hatched with oblique lines indicate flow velocities in a comparative example, while the graphs without the hatching indicate the flow velocities for the arrangement of the semiconductor chips 78 illustrated in FIG. 5. In the comparative example, the center position 84 of the fin region 95 and the center position 82 of the chip region 80 are located at the same position.

As illustrated in FIG. 10, the flow velocity around the semiconductor chip 78-4, where heat from the semiconductor chip 78-4 is relatively difficult to dissipate, can be improved by making the center position 84 of the fin region 95 different from the center position 82 of the chip region 80. Therefore, the semiconductor chip 78-4 can be cooled efficiently, and the thermal distribution in the x-y plane can be made uniform.

Note that, in the examples described in FIG. 1 to FIG. 9, the depth of the first coolant flow channel 30-1 in the z-axis direction may be the same as or different from the depth of the second coolant flow channel 30-2 in the z-axis direction. Also, the depth of each of the coolant flow channels 30 in the z-axis direction may change depending on the positions in the y-axis direction.

Figure 11:
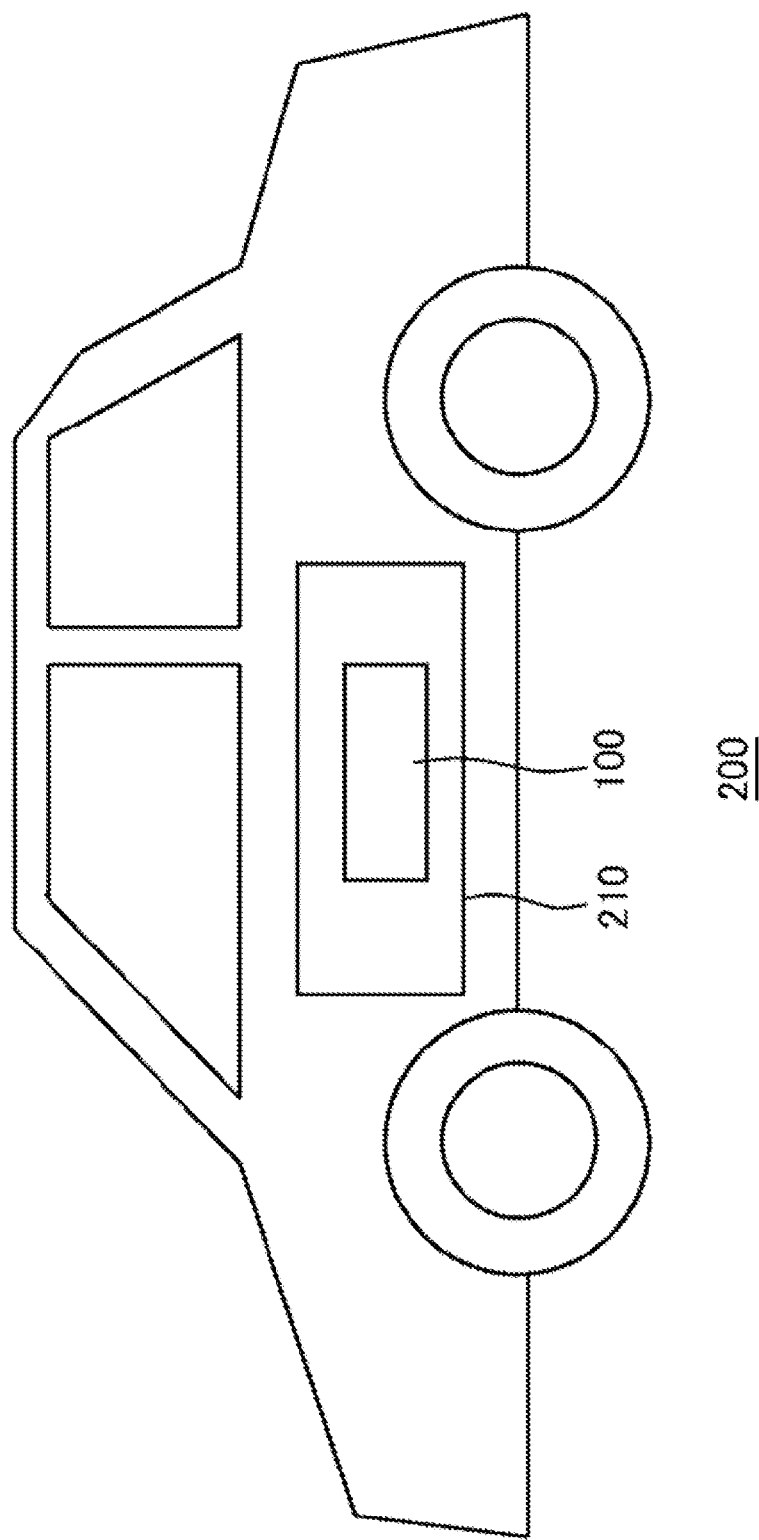
FIG. 11 is a diagram schematically illustrating a vehicle 200 according to one embodiment of the present invention.

FIG. 11 is a diagram schematically illustrating a vehicle 200 according to one embodiment of the present invention. A vehicle 200 is a vehicle which uses electrical power to generate at least part of thrust. As an example, the vehicle 200 is an electric vehicle in which a power-driven device such as a motor generates all of thrust, or a hybrid vehicle which uses a power-driven device such as a motor in conjunction with an internal combustion engine driven by fuel such as gasoline.

The vehicle 200 includes a control apparatus 210 (an external apparatus) configured to control the power-driven device such as a motor. The semiconductor module 100 is provided in the control apparatus 210. The semiconductor module 100 may control electrical power to be supplied to the power-driven device.

Figure 12:
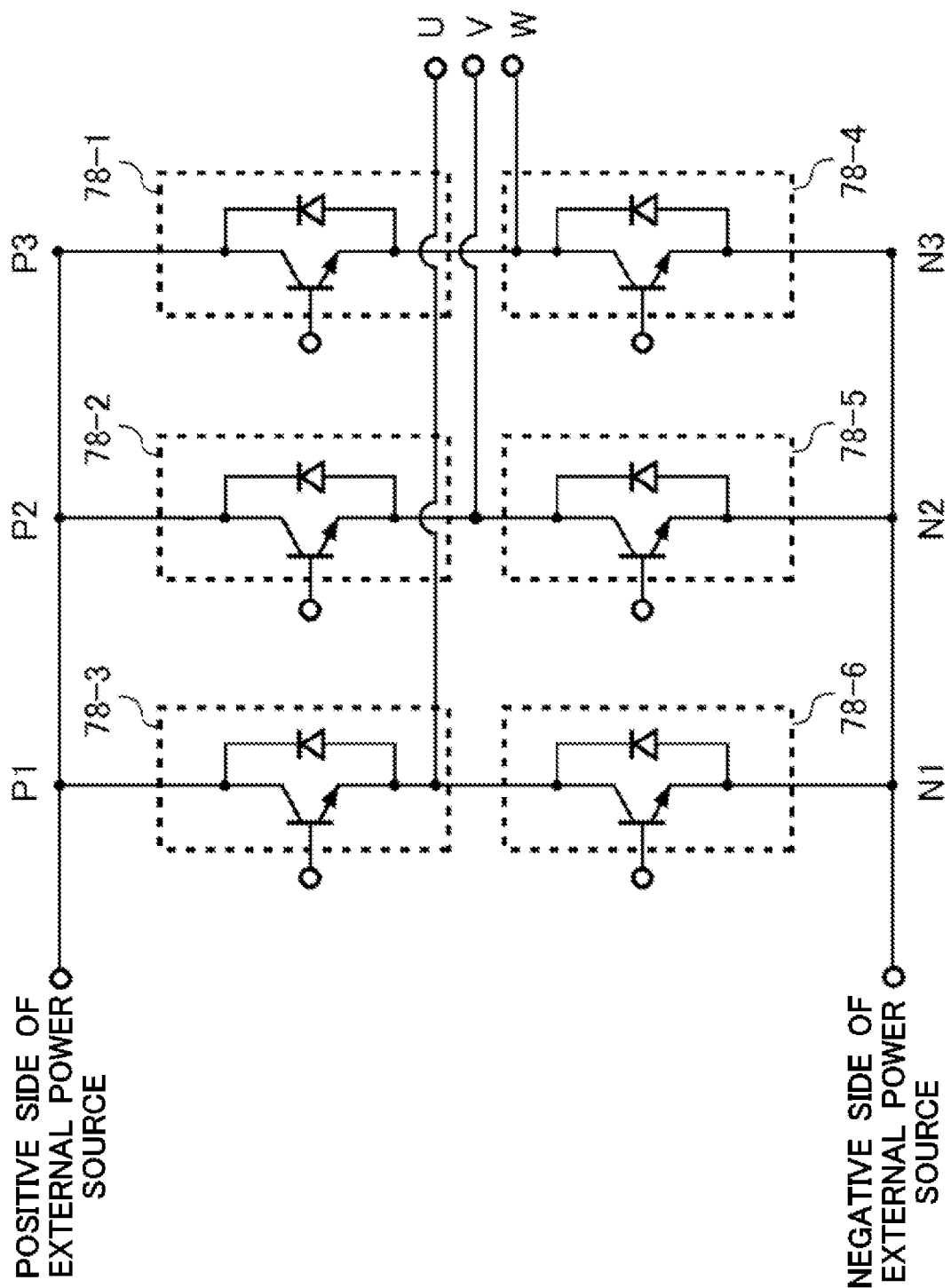
FIG. 12 is a main circuit diagram of a semiconductor module 100 according to one embodiment of the present invention.

FIG. 12 is a main circuit diagram of the semiconductor module 100 according to one embodiment of the present invention. The semiconductor module 100 may constitute a part of an in-vehicle unit configured to drive the motor of a vehicle. The semiconductor module 100 may serve as a three-phase alternating current inverter circuit having output terminals U, V, and W.

Semiconductor chips 78-1, 78-2, and 78-3 may constitute an upper arm of the semiconductor module 100, and semiconductor chips 78-4, 78-5, and 78-6 may constitute a lower arm of the semiconductor module 100. A pair of semiconductor chips 78-1, 78-4 may constitute a leg. Similarly, a pair of semiconductor chips 78-2, 78-5 may constitute a leg and a pair of semiconductor chips 78-3, 78-6 may constitute a leg. The emitter electrode and the collector electrode of the semiconductor chip 78-6 may be electrically connected to an input terminal N1 and an output terminal U, respectively. The emitter electrode and the collector electrode of the semiconductor chip 78-3 may be electrically connected to the output terminal U and an input terminal P1, respectively. Similarly, the emitter electrode and the collector electrode of the semiconductor chip 78-5 may be electrically connected to an input terminal N2 and an output terminal V, respectively, and the emitter electrode and the collector electrode of the semiconductor chip 78-4 may be electrically connected to an input terminal N3 and an output terminal W, respectively. Further, the emitter electrode and the collector electrode of the semiconductor chip 78-2 may be electrically connected to the output terminal V and an input terminal P2, respectively, and the emitter electrode and the collector electrode of the semiconductor chip 78-1 may be electrically connected to the output terminal W and an input terminal P3, respectively.

Each of the semiconductor chips 78-1 to 78-6 may be alternately switched on and off by the signal input into the control electrode pads of the semiconductor chips 78. Each of the semiconductor chips 78 in the present example may generate heat at the time of switching. The input terminals P1, P2, and P3 may be connected to the positive side of the external power source, the input terminals N1, N2, and N3 to the negative side of the external power source, and the output terminals U, V, and W to a load, respectively. The input terminals P1, P2, and P3 may be electrically connected to one another, and the other input terminals N1, N2, and N3 may be also electrically connected to one another.

The plurality of semiconductor chips 78-1 to 78-6 of the semiconductor module 100 may each be an RC-IGBT (Reverse Conducting IGBT) semiconductor chip. In the RC-IGBT semiconductor chip, an IGBT and a free wheeling diode (FWD) are integrally formed, and the IGBT and the FWD may be connected in inverse parallel. The plurality of semiconductor chips 78-1 to 786 may each include a combination of a transistor such as MOSFET or IGBT and a diode. The chip substrates for the transistor and the diode may be a silicon substrate, a silicon carbide substrate, or a gallium nitride substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor module comprising:
    a cooling apparatus; and
    a semiconductor device mounted on the cooling apparatus, wherein
    the cooling apparatus includes:
        a cooling fin arranged below the semiconductor device;
        a main-body portion flow channel through which a coolant flows in a predetermined direction to cool the cooling fin;
        a first coolant flow channel that is connected to one side of the main-body portion flow channel and has a first inclined portion upwardly inclined toward the main-body portion flow channel; and
        a conveying channel that, when seen from above, lets the coolant into the first coolant flow channel from a direction perpendicular to the predetermined direction or lets the coolant out of the first coolant flow channel in the direction perpendicular to the predetermined direction;
    wherein the first inclined portion includes a first pair of sidewalls and a first bottom portion together defining a first U-shaped channel.

2. The semiconductor module according to claim 1, wherein
    the cooling apparatus further includes a second coolant flow channel that is connected to another side of the main-body portion flow channel and has a second inclined portion upwardly inclined toward the main-body portion flow channel;
    wherein the second inclined portion includes a second pair of sidewalls and a second bottom portion together defining a second U-shaped channel.

3. The semiconductor module according to claim 2, wherein
    the conveying channel lets the coolant into or out of the first coolant flow channel from an outside of the cooling fin in the predetermined direction.

4. The semiconductor module according to claim 3, wherein
    the conveying channel lets the coolant into or out of the first coolant flow channel from below the cooling fin.

5. The semiconductor module according to claim 3, wherein
    the conveying channel lets the coolant into or out of the first coolant flow channel from below the main-body portion flow channel.

6. The semiconductor module according to claim 4, wherein
    when seen from above, the first coolant flow channel overlaps with at least a part of the cooling fin.

7. The semiconductor module according to claim 6, wherein
    when seen from above, an overlap width in the predetermined direction between the first coolant flow channel and the cooling fin is substantially constant in the direction perpendicular to the predetermined direction.

8. The semiconductor module according to claim 7, wherein
    when seen from above, the second coolant flow channel overlaps with at least a part of the cooling fin.

9. The semiconductor module according to claim 8, wherein
    when seen from above, an overlap width in the predetermined direction between the second coolant flow channel and the cooling fin is substantially constant in the direction perpendicular to the predetermined direction.

10. The semiconductor module according to claim 6, wherein
    the semiconductor device includes:
        one or more semiconductor chips; and
        one or more circuit boards to which the one or more semiconductor chips are fixed.

11. The semiconductor module according to claim 10, wherein
    the cooling apparatus further includes:
        a top plate, the one or more circuit boards being fixed to an upper surface of the top plate; and
        a bottom plate arranged substantially in parallel with the top plate, and the main-body portion flow channel is formed to include the top plate and the bottom plate.

12. The semiconductor module according to claim 11, wherein
when seen from above, the main-body portion flow channel has a substantially rectangular shape.

13. The semiconductor module according to claim 12, wherein
one side of the first coolant flow channel is provided at least in an area facing the one or more semiconductor chips in the predetermined direction, the one side being closer to the main-body portion flow channel.

14. The semiconductor module according to claim 13, wherein
an opposite side of the first coolant flow channel is provided at least below the main-body portion flow channel, the opposite side being farther away from the main-body portion flow channel.

15. The semiconductor module according to claim 14, wherein the cooling fin is connected to a lower surface of the top plate.

16. The semiconductor module according to claim 15, wherein
the cooling fin is spaced apart from an upper surface of the bottom plate.

17. The semiconductor module according to claim 16, wherein
at least one semiconductor chip among the one or more semiconductor chips is positioned such that a straight line given by extending the first inclined portion intersects the at least one semiconductor chip.

18. The semiconductor module according to claim 17, wherein
the cooling fin is configured with columnar structures connected to the lower surface of the top plate, the columnar structures being arranged in a predetermined pattern.

19. The semiconductor module according to claim 17, wherein
the cooling fin is configured with at least partly plate-shaped structures connected to the lower surface of the top plate, the at least partly plate-shaped structures being arranged in a predetermined pattern.

20. The semiconductor module according to claim 17, wherein
the cooling fin is configured with plate-shaped structures arranged substantially parallel to the top plate and provided with an opening through which the coolant flows.

21. The semiconductor module according to claim 20, wherein
when seen from above, a fin region in which the cooling fin is provided has a substantially rectangular shape, and the fin region extends from the first coolant flow channel to the second coolant flow channel.

22. The semiconductor module according to claim 1, wherein the sidewalls of the first pair of sidewalls are substantially parallel.

23. A semiconductor module comprising:
a cooling apparatus; and
a semiconductor device mounted on the cooling apparatus, wherein
the cooling apparatus includes:
a cooling fin arranged below the semiconductor device;
a main-body portion flow channel through which a coolant flows in a predetermined direction to cool the cooling fin;
a first coolant flow channel that is connected to one side of the main-body portion flow channel and has a first inclined portion upwardly inclined toward the main-body portion flow channel; and
a conveying channel that, when seen from above, lets the coolant into the first coolant flow channel from a direction perpendicular to the predetermined direction or lets the coolant out of the first coolant flow channel in the direction perpendicular to the predetermined direction;
wherein
the first inclined portion includes a first pair of sidewalls and a first bottom portion together defining a first U-shaped channel, and
when seen from above, the first inclined portion overlaps with at least a part of the cooling fin.

* * * * *